United States Patent

Yamashita

(10) Patent No.: US 8,708,460 B2
(45) Date of Patent: Apr. 29, 2014

(54) PIEZOELECTRIC ACTUATOR DEVICE AND PRINTER

(75) Inventor: Toru Yamashita, Nagoya (JP)

(73) Assignee: Brother Kogyo Kabushiki Kaisha, Aichi-Ken (JP)

(*) Notice: Subject to any disclaimer, the term of this patent is extended or adjusted under 35 U.S.C. 154(b) by 0 days.

(21) Appl. No.: 13/330,977

(22) Filed: Dec. 20, 2011

(65) Prior Publication Data

US 2012/0154488 A1     Jun. 21, 2012

(30) Foreign Application Priority Data

Dec. 21, 2010   (JP) ................................ 2010-284100

(51) Int. Cl.
    *B41J 2/16*          (2006.01)
(52) U.S. Cl.
    USPC ........................................................... 347/50
(58) Field of Classification Search
    USPC .................................. 347/58, 68, 72
    See application file for complete search history.

(56) References Cited

U.S. PATENT DOCUMENTS

| | | | | |
|---|---|---|---|---|
| 4,398,204 A * | 8/1983 | Dietrich et al. | ............... | 347/68 |
| 5,541,628 A * | 7/1996 | Chang et al. | ................... | 347/10 |
| 5,619,234 A * | 4/1997 | Nagato et al. | .................. | 347/55 |
| 6,045,209 A * | 4/2000 | Imai | ................. | 347/11 |
| 6,918,659 B2 * | 7/2005 | Junhua | ............................ | 347/71 |
| 7,537,313 B2 * | 5/2009 | Miyata | ............................. | 347/50 |
| 7,857,413 B2 * | 12/2010 | Shamoun | ......................... | 347/19 |
| 2004/0001122 A1 * | 1/2004 | Miyata | ............................. | 347/68 |
| 2004/0046838 A1 * | 3/2004 | Junhua | ............................ | 347/68 |
| 2004/0108790 A1 * | 6/2004 | Junhua et al. | ................. | 310/311 |
| 2004/0223027 A1 * | 11/2004 | Shinkawa et al. | ............... | 347/23 |
| 2004/0227782 A1 * | 11/2004 | Shinkawa et al. | ............... | 347/19 |
| 2004/0252151 A1 * | 12/2004 | Higuchi et al. | ................... | 347/19 |
| 2006/0197806 A1 * | 9/2006 | Komatsu | .......................... | 347/57 |
| 2006/0214996 A1 * | 9/2006 | Matsuzaki et al. | ............. | 347/71 |
| 2007/0046701 A1 * | 3/2007 | Kondoh | ............................. | 347/9 |
| 2007/0236521 A1 * | 10/2007 | Kondoh | ........................... | 347/10 |
| 2008/0111859 A1 | 5/2008 | Kondo | | |
| 2010/0007704 A1 * | 1/2010 | Nitta | ............................... | 347/68 |
| 2010/0026745 A1 * | 2/2010 | Kayahara | ........................ | 347/10 |
| 2010/0128075 A1 * | 5/2010 | Yamashita | ........................ | 347/9 |
| 2010/0245424 A1 * | 9/2010 | Yamashita | ........................ | 347/10 |
| 2010/0247743 A1 * | 9/2010 | Komori et al. | ..................... | 427/8 |
| 2011/0025740 A1 * | 2/2011 | Kondoh | ............................ | 347/10 |
| 2011/0207241 A1 * | 8/2011 | Tomisaka et al. | ................. | 438/5 |
| 2011/0242225 A1 * | 10/2011 | Yamashita | ....................... | 347/68 |

FOREIGN PATENT DOCUMENTS

JP       2008/1200223       5/2008

* cited by examiner

*Primary Examiner* — Matthew Luu
*Assistant Examiner* — Patrick King
(74) *Attorney, Agent, or Firm* — Frommer Lawrence & Haug LLP

(57) ABSTRACT

There is provided a piezoelectric actuator device including a piezoelectric actuator which includes a plurality of piezoelectric elements, each of which has a piezoelectric layer sandwiched between two types of electrodes; and a plurality of driver ICs which drive the piezoelectric elements, wherein a part of the piezoelectric elements are connected to the plurality of driver ICs.

13 Claims, 10 Drawing Sheets

PIEZOELECTRIC ACTUATOR DEVICE AND PRINTER

CROSS REFERENCE TO RELATED APPLICATION

The present application claims priority from Japanese Patent Application No. 2010-284100, filed on Dec. 21, 2010, the disclosure of which is incorporated herein by reference in its entirety.

BACKGROUND OF THE INVENTION

1. Field of the Invention

The present invention relates to a piezoelectric actuator device and a printer including the piezoelectric actuator device.

2. Description of the Related Art

There has been conventionally used, in various technical fields, a piezoelectric actuator which drives a piezoelectric element by changing a voltage applied between two types of electrodes sandwiching the piezoelectric element therebetween. For example, Japanese Patent Application Laid-Open No. 2008-120023 (FIG. 1) discloses a piezoelectric actuator usable in an ink-jet head, which jets ink from nozzles.

The piezoelectric actuator described in Japanese Patent Application Laid-Open No. 2008-120023 is provided to cover a channel unit of the ink-jet head which includes a plurality of pressure chambers each communicating with a plurality of nozzles. The piezoelectric actuator applies a pressure to the ink in each of the pressure chambers so as to jet the ink from each of the nozzles. More specifically, the piezoelectric actuator described in Japanese Patent Application Laid-Open No. 2008-120023 includes a piezoelectric layer arranged to cover the plurality of pressure chambers of the channel unit and two types of electrodes (a plurality of individual electrodes and a common electrode) provided on both surfaces of the piezoelectric layer, respectively. The two types of electrodes are arranged to sandwich the piezoelectric layer therebetween and are arranged to face the plurality of pressure chambers, respectively. In this construction, when a driver IC applies the voltage between the two types of electrodes, piezoelectric deformation occurs in a plurality of piezoelectric layer portions (piezoelectric elements) each of which is sandwiched between the two types of electrodes. Due to this deformation, the pressure is applied to the ink in each of the pressure chambers.

In general, one piezoelectric element is connected to one driver IC. Although two driver ICs are used in the piezoelectric actuator described in Japanese Patent Application Laid-Open No. 2008-120023, the plurality of piezoelectric elements are separated into two groups and each of the two groups corresponds to one of the two driver ICs. That is, in principle, each of the piezoelectric elements is connected to one of the two driver ICs.

SUMMARY OF THE INVENTION

Here, an electrostatic capacitance of the piezoelectric element sandwiched between the two types of electrodes varies among the plurality of piezoelectric elements. Similarly, a wiring resistance of a wiring line connecting the driver IC with the piezoelectric element also varies among a plurality of wiring lines. For example, the electrostatic capacitance of the piezoelectric element varies according to fluctuation of a thickness of the piezoelectric layer, and the wiring resistance of the wiring line varies depending on a length of each wiring line to be drawn. When there is variation in the electrostatic capacitance and/or the wiring resistance as described above, a rise time $T_r$ (or a fall time $T_f$) of the voltage applied between the two types of electrodes sandwiching the piezoelectric element therebetween varies among the plurality of individual electrodes. As a result, operation is performed non-uniformly among the piezoelectric elements, thereby causing variation of jet characteristic among the nozzles of the ink-jet head.

In view of the above, an object of the present teaching is to provide a piezoelectric actuator device which makes it possible to perform operation uniformly among a plurality of piezoelectric elements.

According to an aspect of the present teaching, there is provided a piezoelectric actuator device including a piezoelectric actuator which includes a plurality of piezoelectric elements, each of which has two types of electrodes and a piezoelectric layer sandwiched between the two types of electrodes; and a plurality of driver ICs, each of which is connected to the piezoelectric elements via a plurality of wiring lines and drives the piezoelectric elements by changing a voltage applied between the two types of electrodes of each of the piezoelectric elements, wherein a part of the piezoelectric elements are connected to the plurality of the driver ICs.

According to the piezoelectric actuator device of the present teaching, at least a part of the piezoelectric elements are each connected to at least two or more driver ICs of a plurality of driver ICs. In an equivalent circuit, a plurality of wiring lines are connected between the driving ICs and the piezoelectric elements in parallel. Therefore, as compared with a case in which each of the piezoelectric elements is connected to only one driver IC, the wiring resistance of the wiring line connecting the piezoelectric element to the driver IC is small, and thus the time constant is also small.

Further, according to another viewpoint, at least the part of the piezoelectric elements are each connected to at least two or more driver ICs of the plurality of the driver ICs as described above. Thus, as compared with the case in which each of the piezoelectric elements is connected to only one driver IC, it is possible to supply a charging current from more driver ICs and it is possible to quicken a charging rate of the charging current to be supplied to each of the piezoelectric elements. Therefore, as for at least the part of the piezoelectric elements each connected to the plurality of the driver ICs, it is possible to shorten a rise time $T_r$ (a fall time $T_f$) of the voltage applied between the two types of electrodes sandwiching the piezoelectric element therebetween. Accordingly, it is possible to perform the operation uniformly among the plurality of piezoelectric elements by connecting each of the at least the part of the piezoelectric elements to the plurality of the driver ICs.

BRIEF DESCRIPTION OF THE DRAWINGS

FIG. 6A to 6C show voltage waveforms each illustrating the rise time Tr (the fall time Tf) of the voltage, wherein FIG. 6A shows a voltage waveform at an output section of a driver IC; FIG. 6B is a voltage waveform at the individual electrode when the voltage is applied from one driver IC; and FIG. 6C is a voltage waveform at the individual electrode when the voltage is applied from two driver ICs.

DESCRIPTION OF THE PREFERRED EMBODIMENTS

Hereinafter, an explanation will be made about an embodiment of the present teaching. The embodiment is an example where the present teaching is applied to an ink-jet printer which includes an ink-jet head jetting ink onto a recording paper.

Figure 1:
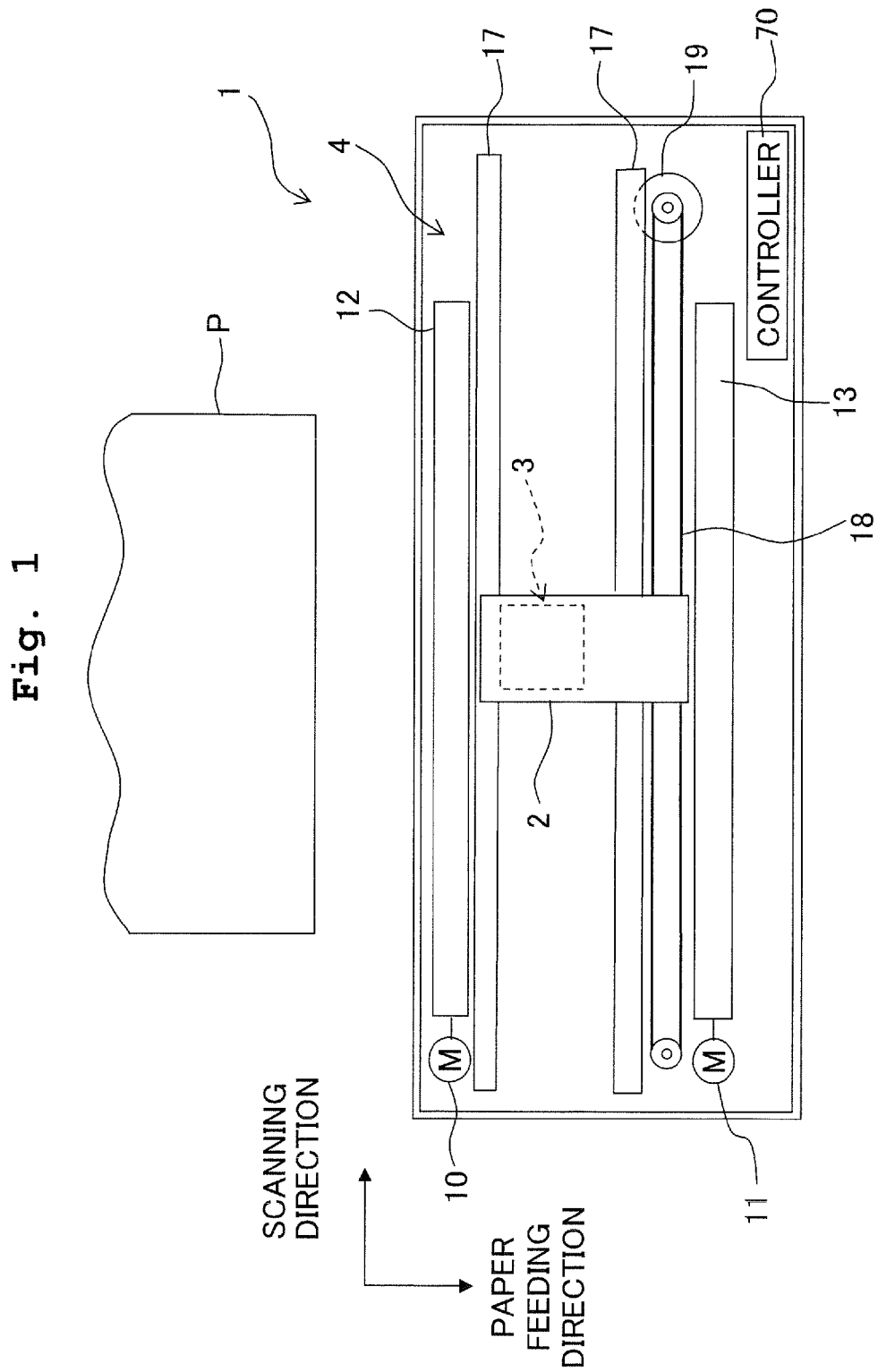
FIG. 1 is a plan view schematically showing an ink-jet printer according to an embodiment.

At first, a schematic structure of an ink-jet printer of this embodiment will be explained. As shown in FIG. 1, an ink jet printer 1 includes a carriage 2 which is configured to be reciprocatively movable in a predetermined scanning direction (a left-right direction of FIG. 1), an ink-jet head 3 which is carried on the carriage 2, a transport mechanism 4 which transports a recording paper P in a paper feeding direction perpendicular to the scanning direction, and the like.

The carriage 2 is configured to be movable in a reciprocating manner along two guide shafts 17 extending parallel to the scanning direction (left-right direction of FIG. 1). Further, the carriage 2 is connected to an endless belt 18 and thus moves in the scanning direction along with the movement of the endless belt 18 when the endless belt 18 is driven to move by a carriage drive motor 19.

The ink-jet head 3 is installed on the carriage 2. A plurality of nozzles 35 (see FIGS. 2 and 3) are formed in the lower surface (the back side of the page of FIG. 1) of the ink-jet head 3. The ink-jet head 3 is configured to jet the ink supplied from an ink cartridge (not shown) through the plurality of nozzles 35 onto the recording paper P transported toward the lower side of FIG. 1 (in the paper feeding direction) by the transport mechanism 4.

The transport mechanism 4 includes a paper feeding roller 12 arranged on the upstream side of the ink-jet head 3 in the transport direction, and a paper discharging roller 13 arranged on the downstream side of the ink-jet head 3 in the transport direction. The paper feeding roller 12 and the paper discharging roller 13 are driven to rotate by a paper feeding motor 10 and a paper discharging motor 11, respectively. Then, the transport mechanism 4 transports the recording paper P from the upper side of FIG. 1 toward the ink-jet head 3 by the paper feeding roller 12 and discharges the recording paper P, on which images, characters, etc., have been recorded by the ink-jet head 3, to the lower side of FIG. 1 by the paper discharging roller 13.

Figure 2:
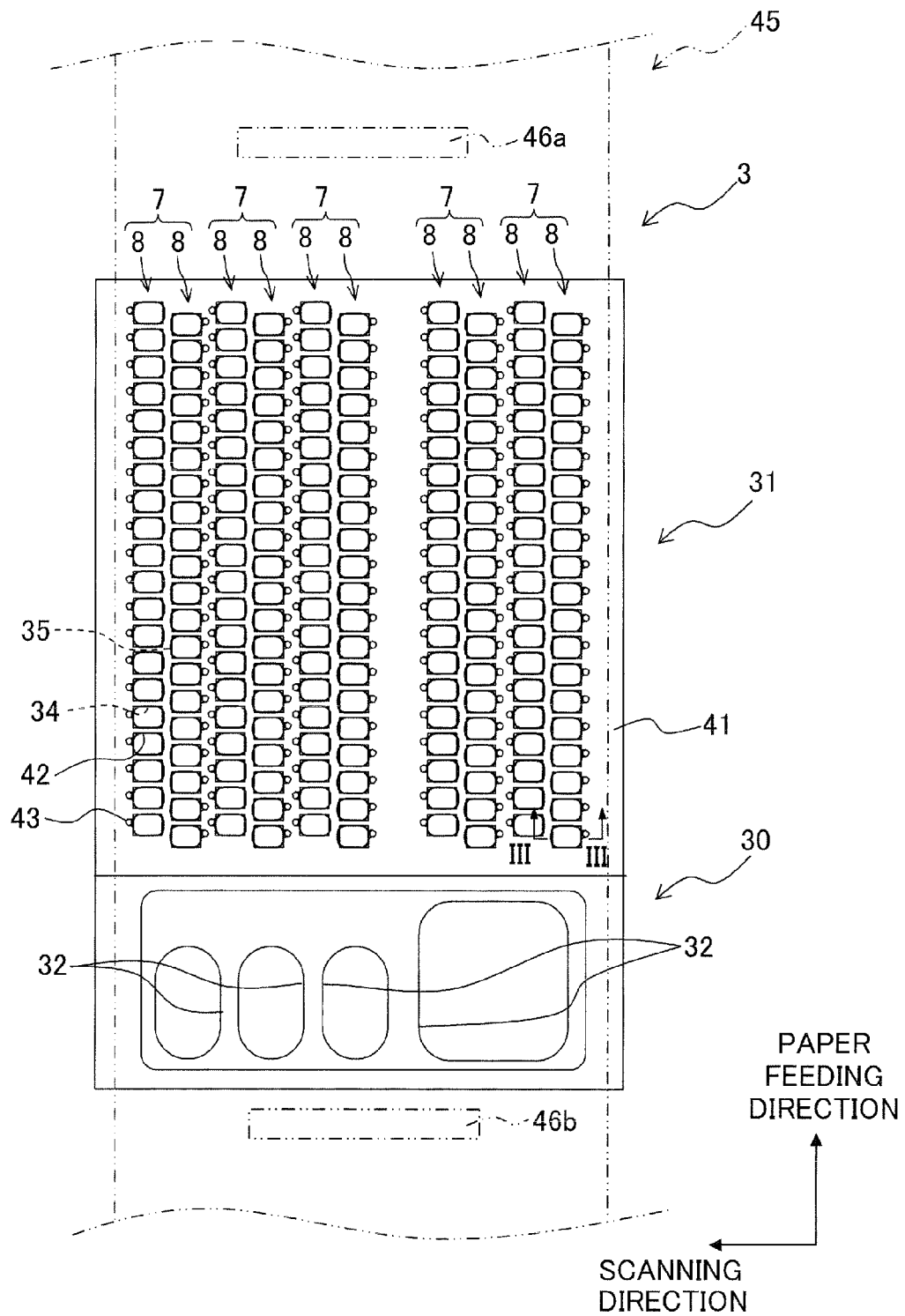
FIG. 2 is a plan view of an ink-jet head.
Figure 3:
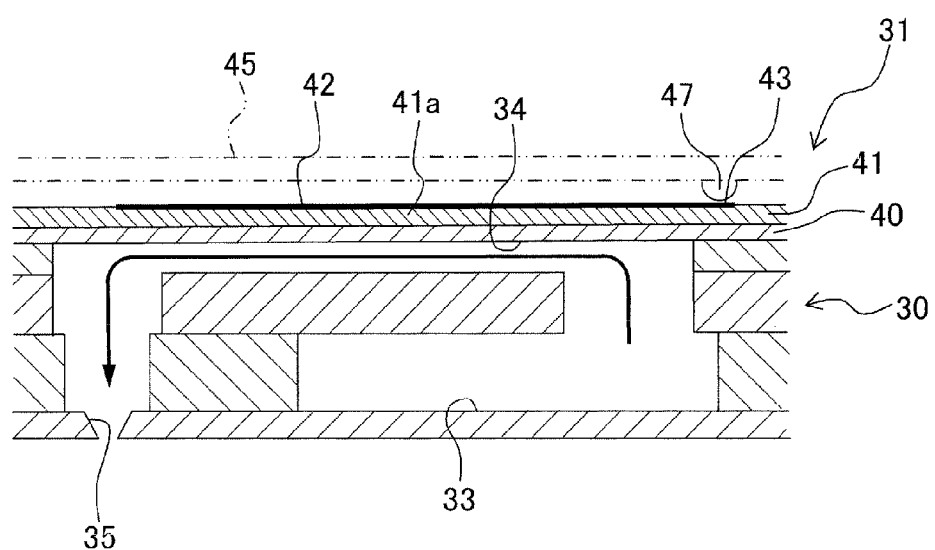
FIG. 3 is a cross-sectional view taken along the line III-III of FIG. 2.

Next, the ink-jet head 3 will be explained. In FIG. 2, which is the plan view of the ink-jet head, a FPC (flexible printed circuit board) 45 which is arranged over or above a piezoelectric actuator 31 is depicted by two-dot lines. As shown in FIGS. 2 and 3, the ink-jet head 3 has a channel unit 30 in which ink channels including the nozzles 35 and pressure chambers 34 are formed, the piezoelectric actuator 31 which applies a pressure to the ink in the pressure chambers 34, and the FPC 45 which covers the upper surface of the piezoelectric actuator 31.

First, the channel unit 30 will be explained. The channel unit 30 is configured such that a plurality of plates is stacked. In the channel unit 30, there are formed four ink supply ports 32 connected respectively to unillustrated four ink-cartridges, manifolds 33 connected respectively to the ink supply ports 32 and extending in a vertical direction in FIG. 2 (in the paper feeding direction) perpendicular to the scanning direction, the plurality of pressure chambers 34 communicating with the manifolds 33 respectively, and the plurality of nozzles 35 communicating with the plurality of pressure chambers 34 respectively. In the channel unit 30, five pressure chamber groups 7 aligned in the scanning direction are provided. Each of the pressure chamber groups 7 includes two pressure chamber rows 8 adjacent with respect to the scanning direction. Each of the pressure chamber rows 8 includes the plurality of pressure chambers 34 arranged along the manifolds 33 extending in the paper feeding direction.

Further, of the five pressure chamber groups 7, two pressure chamber groups 7 positioned on the right side in FIG. 2 are the pressure chamber groups 7 for a black ink to which the black ink is supplied from the large ink supply port 32. Further, three pressure chamber groups 7 positioned on the left side in FIG. 2 are the pressure chamber groups 7 for color inks to which three color inks (yellow, magenta, cyan) are supplied respectively from the other three ink supply ports 32.

The plurality of nozzles 35, which communicate with the pressure chambers 34 respectively, are formed to penetrate through the lower surface of the channel unit 30. Further, these plurality of nozzles 35 are arranged in rows in the same manner as the pressure chambers 34. On the right side of FIG. 2, two nozzle groups are arranged to correspond to the two pressure chamber groups 7 for the black ink, while on the left side of FIG. 2 three nozzle groups are arranged to correspond to the three pressure chamber groups 7 for the three color inks.

On a surface of the channel unit 30 on which the nozzles 35 are formed (a nozzle surface 30a), there is formed an area having a large spacing distance (a gap area) between the nozzles groups for the black ink and the nozzle groups for the color inks. When a purge operation for forcibly discharging the ink in the nozzles 35 of the channel unit 30 is performed, the gap area is brought in contact with a lip partitioning a space, which is defined by a cap (not shown) covering the nozzle surface 30a, into two spaces. Since the cap is formed with the lip partitioning the space, the purge operation of the nozzle groups for the black ink and the purge operation of the nozzle groups for the color inks can be performed independently from each other. Further, since the gap area is formed between the nozzle groups for the black ink and the nozzle groups for the color inks, it is possible to suppress mixture of the black ink and the color inks due to adhesion of the black ink to the nozzles 35 for the color inks when a wiping operation is performed in the paper feeding direction with a wiper extending in the scanning direction.

Next, the piezoelectric actuator 31 will be explained. The piezoelectric actuator 31 includes a vibration plate 40 which is joined onto the channel unit 30 to cover the pressure chambers 34, a piezoelectric layer 41 which is arranged on the upper surface of the vibration plate 40, and a plurality of individual electrodes 42 which are provided on the upper surface of the piezoelectric layer 41 to correspond to the pressure chambers 34.

The vibration plate 40 is, in a plane view, an approximately rectangular metallic plate which is, for example, formed of an iron-base alloy such as stainless steels and the like, a copperbase alloy, a nickel-base alloy, a titanium-base alloy, or the like. This vibration plate 40 is adhered to the upper surface of the top plate of the channel unit 30 in a state of being arranged to cover the plurality of pressure chambers 34. Further, the upper surface of the vibration plate 40 has electrical conductivity characteristic. Accordingly, when the vibration plate 40 is arranged on the lower surface side of the piezoelectric layer 41, the vibration plate 40 can also act as a common electrode that generates an electric field in a thickness direction in the piezoelectric layer 41 between the vibration plate 40 and the individual electrodes 42 disposed on the upper surface of the piezoelectric layer 41. The vibration plate 40 as the common electrode is constantly maintained at the ground potential via the FPC 45.

The piezoelectric layer 41 is formed of a piezoelectric material composed mainly of lead zirconium titanate (PZT) which is a ferroelectric and a solid solution of lead titanate and lead zirconate. As shown in FIG. 2, the piezoelectric layer 41 is formed continuously on the upper surface of the vibration plate 40 to cover the plurality of pressure chambers 34. Further, of the piezoelectric layer 41, at least regions facing the pressure chambers 34 are each polarized in the thickness direction.

The individual electrodes 42 are disposed on the upper surface of the piezoelectric layer 41 at the regions facing the pressure chambers 34. Each of the individual electrodes 42 has a substantially elliptical shape slightly smaller than the pressure chamber 34 as viewed in a plan view and faces the center portion of one of the pressure chambers 34. Further, a plurality of contact portions 43 connected to the FPC 45 are led out from end portions of the individual electrodes 42 along a longitudinal direction of the individual electrodes 42 respectively.

Further, the plurality of the piezoelectric layer portions (piezoelectric elements: hereinafter referred to as active portions 41a) are sandwiched between the plurality of individual electrodes 42 and the vibration plate 40 as the common electrode. Those active portions 41a are preliminarily polarized in its thickness direction. When a potential difference (voltage) is generated between each of the individual electrodes 42 and the vibration plate 40, a piezoelectric deformation (piezoelectric strain) occurs in each of the active portions 41a. Due to this deformation, the pressure is applied to the ink in each of the pressure chambers 34 facing one of the active portions 41a.

The FPC 45, on which two driver ICs 46a, 46b for driving the piezoelectric actuator 31 are installed, is connected to the piezoelectric actuator 31. The two driver ICs 46a, 46b are electrically connected to the plurality of individual electrodes 42 via wiring lines 48 (see FIG. 4) on the FPC 45, thereby applying the ground potential to the vibration plate 40 as the common electrode.

Next, the operation of the piezoelectric actuator 31 at the time of ink jetting will be explained. When electric charge is not accumulated in the active portion 41a sandwiched between the individual electrode 42 and the vibration plate 40 as the common electrode, a potential of the individual electrode 42 is the ground potential, which is the same potential as the vibration plate 40. In this situation, the electric field is not generated in the active portion 41a, and thus the piezoelectric strain does not occur in the active portion 41a.

When a predetermined driving electric potential is applied to a certain active portion 41a by the driver IC 46 in this state, the electric potential of the individual electrode 42 corresponding to the active portion 41a becomes higher than the ground potential of the vibration plate 40. Thus, a predetermined voltage is applied between the individual electrode 42 and the vibration plate 40 which sandwich the active portion 41a therebetween, and the electric field acts in the active portion 41a in its thickness direction.

The direction of the above electric field is parallel to a polarization direction of the piezoelectric layer 41, so that the active portion 41a contracts in a plane direction perpendicular to the thickness direction. Here, the vibration plate 40 on the lower side of the piezoelectric layer 41 is fixed to the top plate of the channel unit 30. Therefore, when the piezoelectric layer 41 positioned on the upper surface of the vibration plate 40 contracts in the plane direction, the portion of the vibration plate 40 covering the pressure chamber 34 deforms to become convex toward the pressure chamber 34 (unimorph deformation). At this time, since the volume of the pressure chamber 34 reduces, the pressure of the ink in the pressure chamber 34 increases. As a result, the ink is jetted from the nozzle 35 communicating with the pressure chamber 34.

Further, when the electric potential of the individual electrode 42 is returned to the ground potential once again, the electric field does not act in the active portion 41a. Therefore, the deformed state of the active portion 41a is released, and the vibration plate 40 returns to the original state (a state in which the vibration plate 40 is parallel to each plate constructing the channel unit 30).

Figure 4:
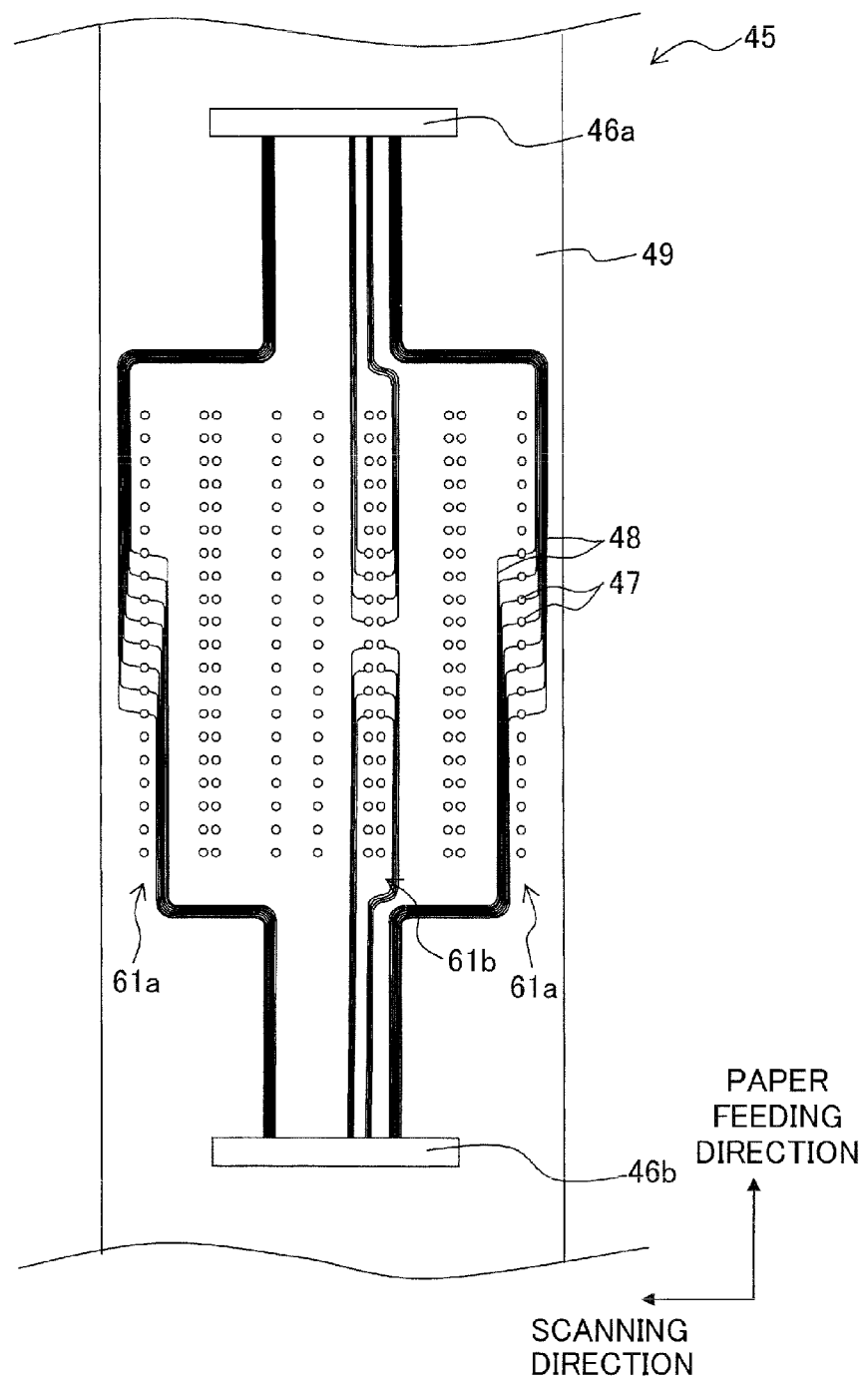
FIG. 4 is a plan view of a flexible printed circuit board (FPC) as viewed from below.

Next, the FPC 45 will be explained. In FIG. 4, only some of the wiring lines are illustrated, and illustration of a number of wiring lines is omitted. As shown in FIG. 2, a center portion of the FPC 45 that is elongated in one direction (paper feeding direction) is joined to the upper surface of the piezoelectric actuator 31 (piezoelectric layer 41) having the individual electrodes 42 disposed thereon. The two driver ICs 46a, 46b are arranged on the FPC 45 in the vicinity of end portions of the both side portions, respectively. The FPC 45 is connected to a control board for driving the two driver ICs 46a, 46b at tip portions of the both side portions which sandwich a portion joined to the piezoelectric actuator 31.

As shown in FIG. 4, the FPC 45 includes a board 49, a plurality of bumps 47 formed on the surface of the board 49, and the wiring lines 48 connecting the bumps 47 with the two drivers ICs 46a, 46b. The bumps 47 form a plurality of bump rows 61a, 61b aligned in the scanning direction. In each of the bump rows 61a, 61b, the bumps 47 are arranged and aligned corresponding to rows of the contact portions 43 of the piezoelectric actuator 31 with predetermined spacing distances in the paper feeding direction. Each of the bumps 47 belonging to the bump rows 61a disposed on both sides in the scanning direction is connected, via two wiring lines 48, to output sections of the two driver ICs 46a, 46b.

More specifically, the driver IC 46a, which is one of the two driver ICs to be connected, is connected with one side portion of each of the bumps 47 belonging to the bump rows 61a, that is, as shown in FIG. 4, the driver IC 46a is connected with a right side portion of each of the bumps 47 belonging to the bump row 61a disposed on the right side. Further, the driver IC 46b, which is the other of the two driver ICs to be connected, is connected with the other side portion of each of the bumps 47 belonging to the bump rows 61a, that is, as shown in FIG. 4, the driver IC 46b is connected with a left side portion of each of the bumps 47 belonging to the bump row 61a disposed on the right side. Furthermore, each of the bumps 47 belonging to remaining bump rows 61b is connected as follows. That is, at first, the bumps 47 are divided into two regions by the center line in the paper feeding direction. Then, each of the wiring lines 48 is drawn along the outside of each bump row 61b in the paper feeding direction so that each of the bumps 47 is connected to the output section of one of the driving ICs 46a, 46b placed at the position closer to each of the bumps 47.

Figure 5:
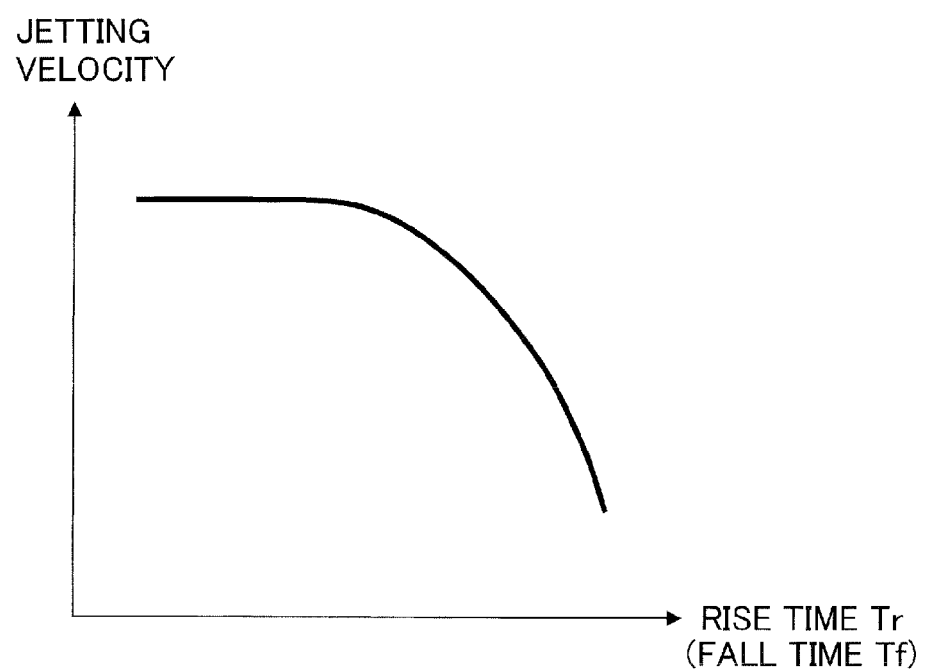
FIG. 5 is a diagram showing a relation between a rise time Tr (a fall time Tf) of voltage applied to an individual electrode and a jetting velocity of ink from a nozzle.

By the way, the jet characteristic of the ink jetted from the nozzle 35 is influenced by a rise time $T_r$ (or a fall time $T_f$) of the voltage, which is applied from the driver IC 46 between the individual electrode 42 and the vibration plate 40 functioning as the common electrode which sandwich the active portion 41a therebetween (the above voltage can be assumed to be the voltage applied to the individual electrode 42, because the vibration plate 40 is maintained at the ground potential). The rise time $T_r$ (the fall time $T_f$) is an amount of time for the ringing of the voltage (an amount of time for the falling of the voltage). For example, the rise time $T_r$ (the fall time $T_f$) is an amount of time during which a voltage value varies in the range of 10% to 90%. The larger the voltage value is, the longer the rise time (the fall time) is, and the smaller the voltage value is, the shorter the rise time (the fall time) is. In general, the rise time $T_r$ is equal to the fall time $T_f$. The following explanation focuses attention on the rise time $T_r$. For example, as shown in FIG. 5, if the rise time $T_r$ is small (short), the jetting velocity of the ink from the nozzle 35 is fast, and if the rise time $T_r$ is large (long), the jetting velocity of the ink from the nozzle 35 is slow. Further, if the rise time $T_r$ becomes smaller than a certain value, the jetting velocity of the ink from the nozzle 35 does not become faster any more, but the jetting velocity of the ink from the nozzle 35 is kept at a saturated velocity.

The plurality of active portions 41a function as capacitors, because each active portion 41a has electrostatic capacitance. The driver IC 46 and each of the active portions 41a are connected by one of the wiring lines 48 (connection paths 54). Each of the wiring lines 48 has a wiring resistance R2, so that a CR circuit exists from the driver IC 46 to each of the active portions 41a in an equivalent circuit. The time constant of the CR circuit has an effect on the rise time $T_r$ of the voltage applied to each of the individual electrodes 42. The time constant of the CR circuit is proportional to the electrostatic capacitance of each of the active portions 41a and the wiring resistance R2 of each of the wiring lines 48 connecting the driver IC 46 with one of the active portions 41a. In a case that the electrostatic capacitance varies among the plurality of active portions 41a or that the wiring resistance R2 varies among the plurality of wiring lines 48 each of which connects the driver IC 46 with the active portion 41a, as described above, the rise time $T_r$ of the voltage applied to each of the individual electrodes 42 varies among the plurality of individual electrodes 42. As a result, the operation is performed non-uniformly among the active portions 41a.

By the way, the inventor has found that when the active portions 41a are arranged in a matrix form as viewed in a plan view as shown in FIG. 2, the active portions 41a, which are disposed on opposite sides in the scanning direction and aligned in the paper feeding direction, of the plurality of the active portions 41a, have larger electrostatic capacitance. According to the inventor's findings, the thickness of the piezoelectric layer 41 is likely to vary in the active portions 41a disposed on the opposite sides in the scanning direction, and thereby the electrostatic capacitance of each of the active portions 41a in this area is likely to be large. That is, the active portions 41a which are disposed on the opposite sides in the scanning direction and aligned in the paper feeding direction have the electrostatic capacitance larger than that of any other active portions 41a. The rise time $T_r$ of the voltage applied to each of the individual electrodes 42 corresponding to one of the active portions 41a disposed on the opposite sides in the scanning direction and aligned in the paper feeding direction is likely to be longer.

In view of this, as for the active portions 41a disposed on the opposite sides in the scanning direction and aligned in the paper feeding direction, the two driver ICs 46a, 46b are connected, via the two wiring lines 48, to each bump 47 connected to the contact portion 43 of the active portion 41a, as shown in FIG. 4. Then, the electrostatic capacitance of each of the active portions 41a connected to the two driver ICs 46a, 46b is measured. The active portions 41a, each of which has the electrostatic capacitance larger than an electrostatic capacitance as an actual design value (a reference electrostatic capacitance), are simultaneously driven by both of the two driver ICs 46a, 46b. The remaining active portions 41a, each of which has the electrostatic capacitance smaller than the electrostatic capacitance as the actual design value, are driven by any one of the driver ICs 46a, 46b. The electrostatic capacitance of each of the active portions 41a is measured by an LCR meter etc., at the time of inspection before the ink-jet printer 1 is shipped, or the like. Note that "a large electrostatic capacitance (of the active portion)" means that "the active portion has an electrostatic capacitance which is larger than the reference electrostatic capacitance", in the specification.

In particular, a controller 70 (see FIG. 1) of the ink-jet printer 1 includes a microcomputer composed of a Central Processing Unit (CPU), a ROM, a RAM, and a bus connecting these components. An Application Specific Integrated Circuit (ASIC) is connected to the bus to control the two driver ICs 46a, 46b of the ink-jet head 3, and the like. The ROM stores information about the active portions 41a, each of which has the electrostatic capacitance larger than the actual design value, of the plurality of active portions 41a, and based on the information stored in the ROM, one or two driver IC(s) is/are driven.

Here, an explanation will be made about the rise time $T_r$ of the voltage applied to the individual electrode 42 corresponding to the active portion 41a, which has the actual large electrostatic capacitance and is connected to the two drivers ICs 46a, 46b.

Figure 6A:
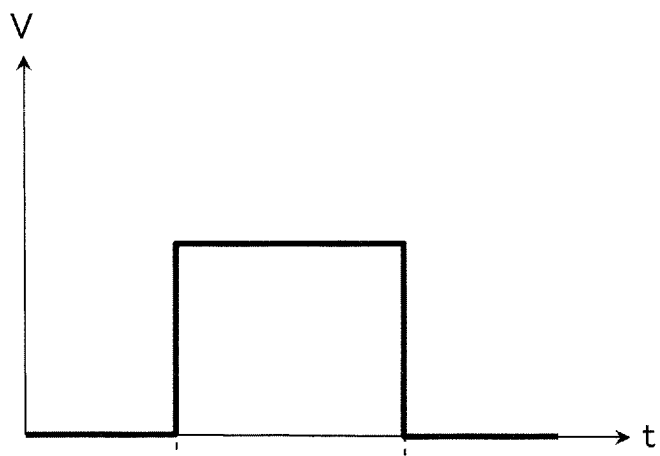

When the voltage is applied from the driver IC 46 to the individual electrode 42, as shown in FIG. 6A, the voltage at the output section of the driver IC 46 rises substantially vertically in a pulse form. When application of the voltage from the driver IC 46 to the individual electrode 42 is stopped, the voltage at the output section of the driver IC 46 falls substantially vertically in a pulse form.

Figure 6B:
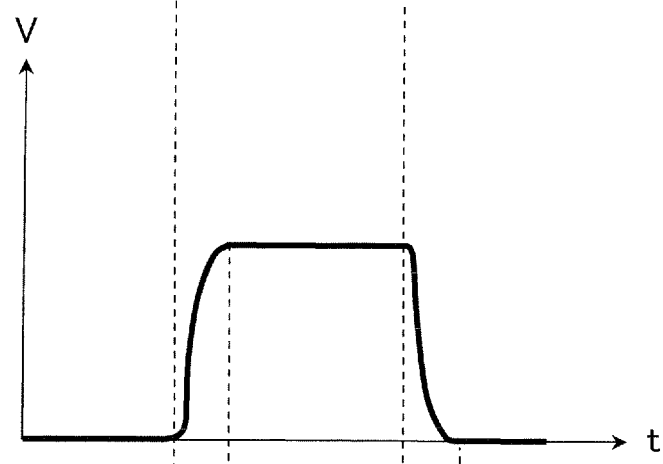
Figure 6C:
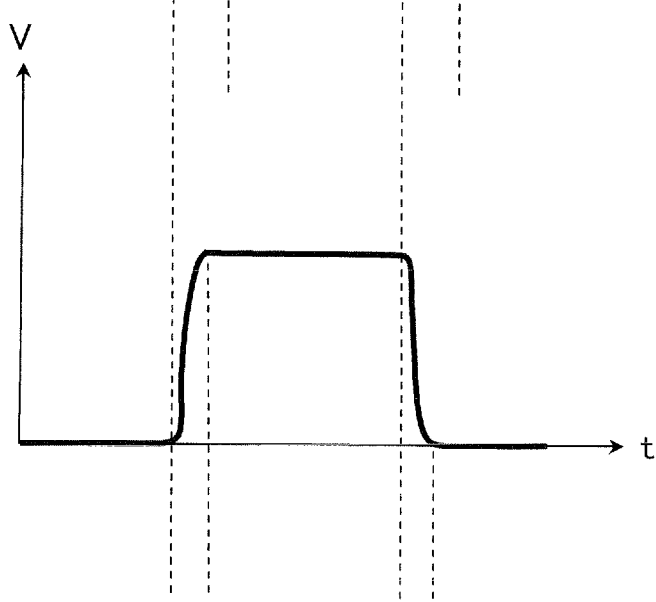

In this situation, for example, when it is assumed that the voltage is applied only from the driver IC 46a to the individual electrode 42 corresponding to the active portion 41a connected to the two driver ICs 46a, 46b, the voltage of the individual electrode 42 does not rise quickly and does not fall quickly, like the voltage at the output section of the driver IC 46a, as shown in FIG. 6B. That is, the voltage of the individual electrode 42 rises and falls gradually. On the contrary, when it is assumed that the voltage is simultaneously applied from the two driver ICs 46a, 46b to the individual electrode 42 corresponding to the active portion 41a connected to the two driver ICs 46a, 46b, the voltage of the individual electrode 42 rises and falls, as shown in FIG. 6C, for a short time as compared with the case shown in FIG. 6B.

The reason thereof is as follows. That is, the active portion 41a is connected by the two wiring lines 48 in order to be driven by both of the two driver ICs 46a, 46b, and thus the wiring resistances R2 of the wiring lines 48 connecting the active portion 41a with the two driver ICs 46a, 46b are reduced, thereby making the time constant of the CR circuit small. Further, according to another viewpoint, it is possible to quicken a supply rate of a charging current by supplying the current from the two driver ICs 46*a*, 46*b*, and it is possible to quicken a discharging rate of a discharging current by discharging the current from the two driver ICs 46*a*, 46*b*. Accordingly, it is possible to shorten the rise time $T_r$ of the voltage applied to each of the individual electrodes 42 corresponding to one of the active portions 41*a* driven by both of the two driver ICs 46*a*, 46*b*.

Therefore, it is possible to perform the operation uniformly among the plurality of active portions 41*a* by connecting each of the active portions 41*a* having the large electrostatic capacitance, of the plurality of active portions 41*a*, to the two driver ICs 46*a*, 46*b*. Accordingly, it is possible to suppress the variation of the jetting velocity of the ink jetted from each nozzle 35, and it is possible to suppress the variation of the jet characteristic of the ink.

Further, each of the active portions 41*a*, which have the electrostatic capacitance larger than the design value, of the plurality of active portions 41*a*, is previously connected to the two driver ICs 46*a*, 46*b*. Then, the electrostatic capacitance of each of the active portions 41*a* connected to the two driver ICs 46*a*, 46*b* is grasped. Then, only the active portions 41*a*, each of which has the electrostatic capacitance actually larger than the design value, are driven by both of the two driver ICs 46*a*, 46*b* to perform the operation uniformly among the plurality of active portions 41*a*. Accordingly, it is possible to use the same wiring pattern among the plurality of the piezoelectric actuators 31 without changing the wiring pattern for each piezoelectric actuator 31. Further, as compared with the case in which all of the active portions 41*a* are each connected to both of the two driver ICs 46*a*, 46*b*, it is possible to reduce the number of wiring lines as much as possible and it is possible to make it easy to draw any other wiring lines.

Further, the two driver ICs 46*a*, 46*b* are disposed on the area, in which the bumps 47 corresponding to the active portions 41*a* are arranged, on the opposite sides in the paper feeding direction. The bumps 47 are arranged to form the plurality of bump rows 61*a*, 61*b*, in which the bumps 47 are aligned in the paper feeding direction parallel to the direction in which the two driver ICs 46*a*, 46*b* are arranged and aligned. The respective bump rows 61*a* disposed on the opposite sides in the scanning direction, of the plurality of bump rows 61*a*, 61*b*, form groups of the bumps 47 connected to the two driver ICs 46*a*, 46*b*. In this construction, a part of the wiring lines 48 are drawn, to one of the two driver ICs 46*a*, 46*b*, along one side of each bump row 61*a* and a remaining part of the wiring lines 48 are drawn, to the other of the two driver ICs 46*a*, 46*b*, along the other side of each bump row 61*a*. Therefore, the drawing around of wiring lines becomes easy.

Next, modified embodiments in which various modifications are made in this embodiment will be described below. The same reference numerals are assigned to components having the same structure as in the above embodiment, and the description of such components is appropriately omitted.

Figure 7:
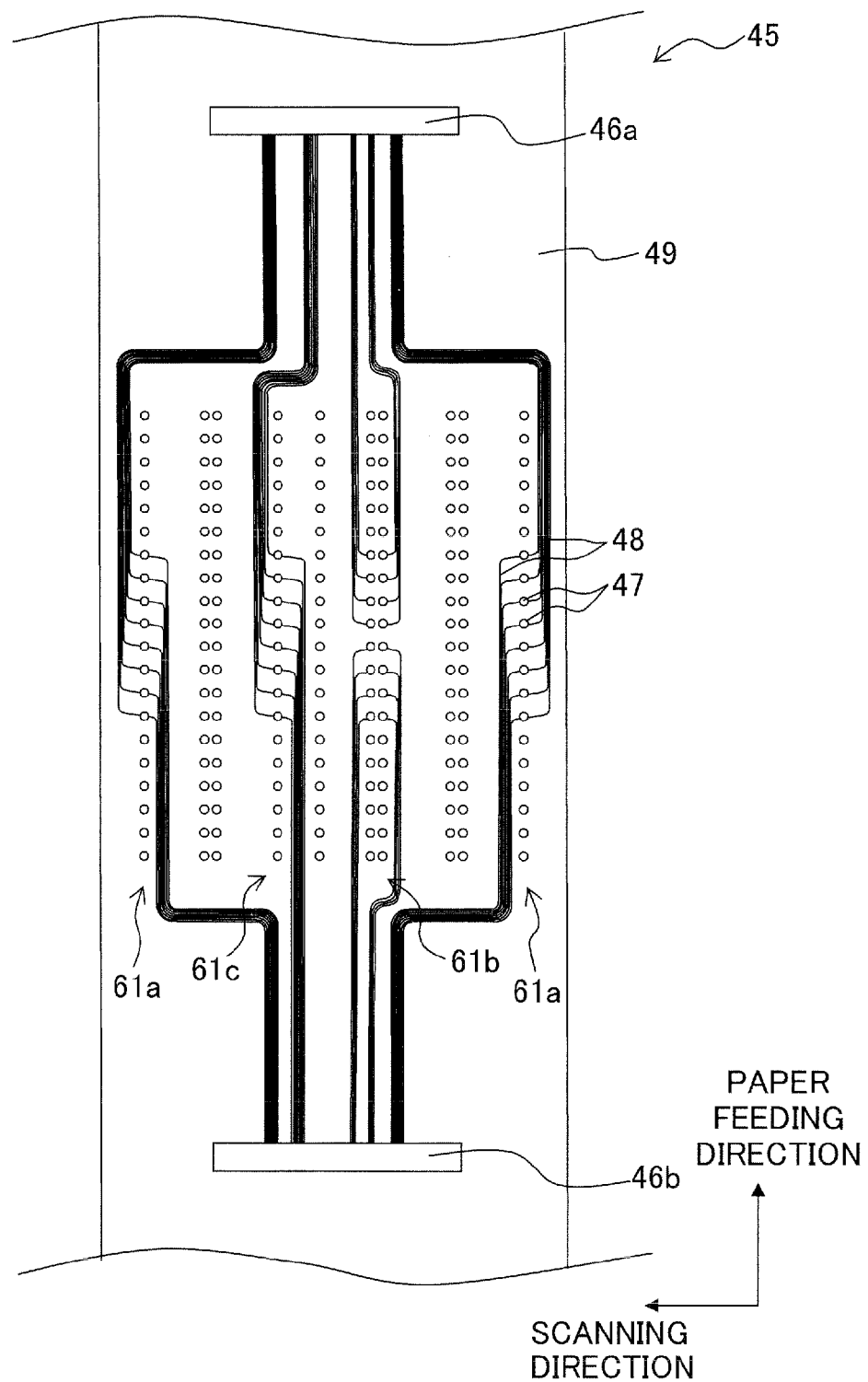
FIG. 7 is a plan view of a flexible printed circuit board of a modified embodiment as viewed from below.

In this embodiment, since the electrostatic capacitance is likely to be large in the active portions 41*a*, which are arranged and aligned on the opposite sides in the scanning direction, of the plurality of active portions 41*a*, the two driver ICs 46*a*, 46*b* are connected to each of these active portions 41*a*. However, the active portions 41*a* other than the active portions 41*a* disposed on the opposite sides in the scanning direction may be each connected to the two driver ICs 46*a*, 46*b*. For example, as described above, there is the large spacing distance (the gap area) between the nozzle groups for the black ink and the nozzle groups for the color inks in the piezoelectric actuator 31 shown in FIG. 2. In view of this, as shown in FIG. 7, each of the bumps 47 which belongs to a bump row 61*c*, which corresponds to the nozzle row belonging to the nozzle group for the black ink, which is adjacent to the nozzle groups for the color inks across the gap area, is also connected to the two driver ICs 46*a*, 46*b*.

For example, in a serial ink-jet head 3, when black and white printing is performed, only some of the nozzles 35 for the black ink are used in some cases, without using all of the nozzles 35 for the black ink. In such a case, the nozzles 35, which correspond to the active portions 41*a* each connected to the two driver ICs 46*a*, 46*b* and which belong to the nozzle rows of the nozzle groups for the black ink disposed on the opposite sides in the scanning direction, are used and the active portions 41*a* corresponding to these nozzles 35 are each driven by the two driver ICs 46*a*, 46*b*. As described above, by using the nozzles 35 corresponding to the active portions 41*a* each connected to the two driver ICs 46*a*, 46*b*, each of the active portions 41*a* corresponding to one of these nozzles 35 is driven by the two driver ICs 46*a*, 46*b*. Accordingly, it is possible to perform the operation uniformly among the active portions 41*a* corresponding to the selected nozzles 35.

Further, in this embodiment, only the active portions 41*a* having the large electrostatic capacitance, of the active portions 41*a* each connected to the two driver ICs 46*a*, 46*b*, are driven by both of the two driver ICs 46*a*, 46*b*. However, all of the active portions 41*a* each connected to the two driver ICs 46*a*, 46*b* may be driven by both of the two driver ICs 46*a*, 46*b*. For example, the electrostatic capacitance of each of the active portions 41*a* is previously measured before the piezoelectric actuator 31 and the FPC 45 are connected. Then, the wiring lines 48 are installed so that only the active portions 41*a* each of which has the actual large electrostatic capacitance (each of which has an electrostatic capacitance larger than the reference electrostatic capacitance) are each connected to the two driver ICs 46*a*, 46*b*. Then, the active portions 41*a* are each driven by both of the two drivers ICs connected thereto. By doing so, it is possible to perform the operation uniformly among the active portions 41*a*. Note that the active portions 41*a* each of which has the actual large electrostatic capacitance may be connected to three or more driver ICs. In this case, the active portions 41*a* each of which has the actual large electrostatic capacitance can be driven by at least two driver ICs connected thereto. It goes without saying that the active portions 41*a* each of which has the actual large electrostatic capacitance can be driven by all of the driver ICs connected thereto. Although the wiring pattern differs depending on each FPC 45 in this manner, the number of wiring lines is not increased wastefully. That is, it is possible to miniaturize the piezoelectric actuator device by reducing the wiring lines for connecting the active portions 41*a* to the driver ICs as much as possible.

Further, in this embodiment, only some of the active portions 41*a* of the plurality of active portions 41*a* are each connected to the two driver ICs 46*a*, 46*b*. However, all of the active portions 41*a* may be each connected to the two driver ICs 46*a*, 46*b*. Then, all of the active portions 41*a* may be each driven by both of the two driver ICs 46*a*, 46*b*. Or it is allowable that only some of the active portions 41*a* are each driven by both of the two driver ICs 46*a*, 46*b* and remaining active portions 41*a* are each driven by only one of the driver ICs 46*a*, 46*b*.

Figure 8:
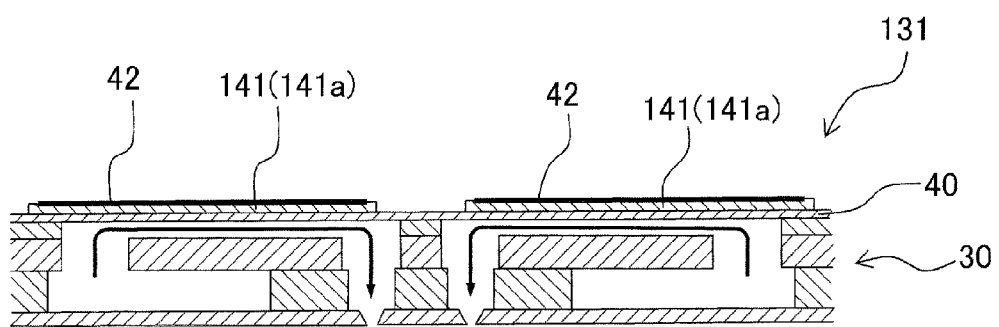
FIG. 8 is a sectional view of an ink-jet head of the modified embodiment.

In addition, in this embodiment, the active portions 41*a* (piezoelectric elements) of the piezoelectric actuator 31 which are disposed adjacently to each other are connected via the peripheral piezoelectric layer 41. However, as shown in FIG. 8, a plurality of active portions 141*a* (piezoelectric elements) of a piezoelectric actuator 131 may be constructed of different piezoelectric layers 141 and may be arranged separately from each other.

Further, in this embodiment, the two driver ICs 46a, 46b are provided. However, three or more driver ICs 46 may be provided. It is allowable that at least a part of the active portions 41a of the plurality of active portions 41a are each connected to two or more driver ICs 46 of the three or more driver ICs 46. In this case, each of the part of the active portion 41a, to which two or more driver ICs 46 are connected, can be driven by at least two driver ICs 46 connected thereto. It goes without saying that each of the part of the active portion 41a, to which two or more driver ICs 46 are connected, can be driven by all of the driver ICs 46 connected thereto.

Further, in this embodiment, the active portions 41a which are disposed on the opposite sides in the scanning direction and which are likely to have the larger electrostatic capacitance are each connected to the two driver ICs 46a, 46b. However, the active portions 41a of the plurality of active portions 41a, each of which is likely to have the larger electrostatic capacitance, may be the active portions 41a which are not disposed on the opposite sides in the scanning direction, depending on an arrangement manner of the active portions 41a and a method for forming the active portion 41a. In such a case, it is allowable that the two driver ICs 46a, 46b are connected to each of the active portions 41a disposed on any positions of an area, in which there are the active portions 41a which are likely to have the large electrostatic capacitance.

Further, it is allowable that the two drivers IC 46a, 46b are not necessarily connected to each of the active portions 41a disposed on the area in which there are the active portions 41a which are likely to have the large electrostatic capacitance. For example, as shown in FIG. 4, in the case that the driver ICs 46a, 46b are arranged on the FPC 45 on the opposite sides in the paper feeding direction and that the bumps 47 corresponding to the active portions 41a are arranged in the form of rows extending in the paper feeding direction, the active portions 41a, which correspond to the bumps 47 placed at the center in the paper feeding direction of the bumps 47 arranged in the form of rows, may be each connected to the two driver ICs 46a, 46b. When it is assumed that, of the bumps 47 extending in the paper feeding direction, the bumps 47 arranged closer to the driver IC 46a are each connected to the driver IC 46a and the bumps 47 arranged closer to the driver IC 46b are each connected to the driver IC 46b, a boundary portion between the bump 47 connected to the driver IC 46a and the bump 47 connected to the driver IC 46b is formed at the center portion of the bumps 47 arranged in the form of row in the paper feeding direction. Corresponding to this, also as for the active portions 41a aligned in the paper feeding direction, a boundary portion between the active portion 41a connected to the driver IC 46a and the active portion 41a connected to the driver IC 46b is formed at the center portion of the ink-jet head 3 in the paper feeding direction. In this construction, since the boundary portion is formed for each of the bump rows (each of the active portion rows) to form a linear boundary portion, when the variation of the jet characteristic is caused by the two driver ICs, there is fear that the printing quality is deteriorated. In view of this, each of the active portions 41a corresponding to the center portion in the paper feeding direction (i.e. each of the active portions 41a corresponding to the linear boundary portion) is connected to the two driver ICs 46a, 46b. By doing so, the variation of the jet characteristic at the linear boundary portion is suppressed, thereby enhancing the printing quality.

Further, as for the two wiring lines 48 connecting one active portion 41a with the two driver ICs 46a, 46b, a width of the wiring line may be increased depending on a length of the wiring line. For example, it is allowable that as the length of the wiring line is longer, the width of the wiring line is thicker. By doing so, it is possible to uniformize the wiring resistances of the two wiring lines 48 connected to one active portion 41a and it is possible to uniformize amounts of heat generated by the two driver ICs 46a, 46b connected with these wiring lines 48. Accordingly, the service lives of the plurality of driver ICs 46 are uniformized, thereby making it possible to extend the service life of the ink-jet head 3.

Figure 9:
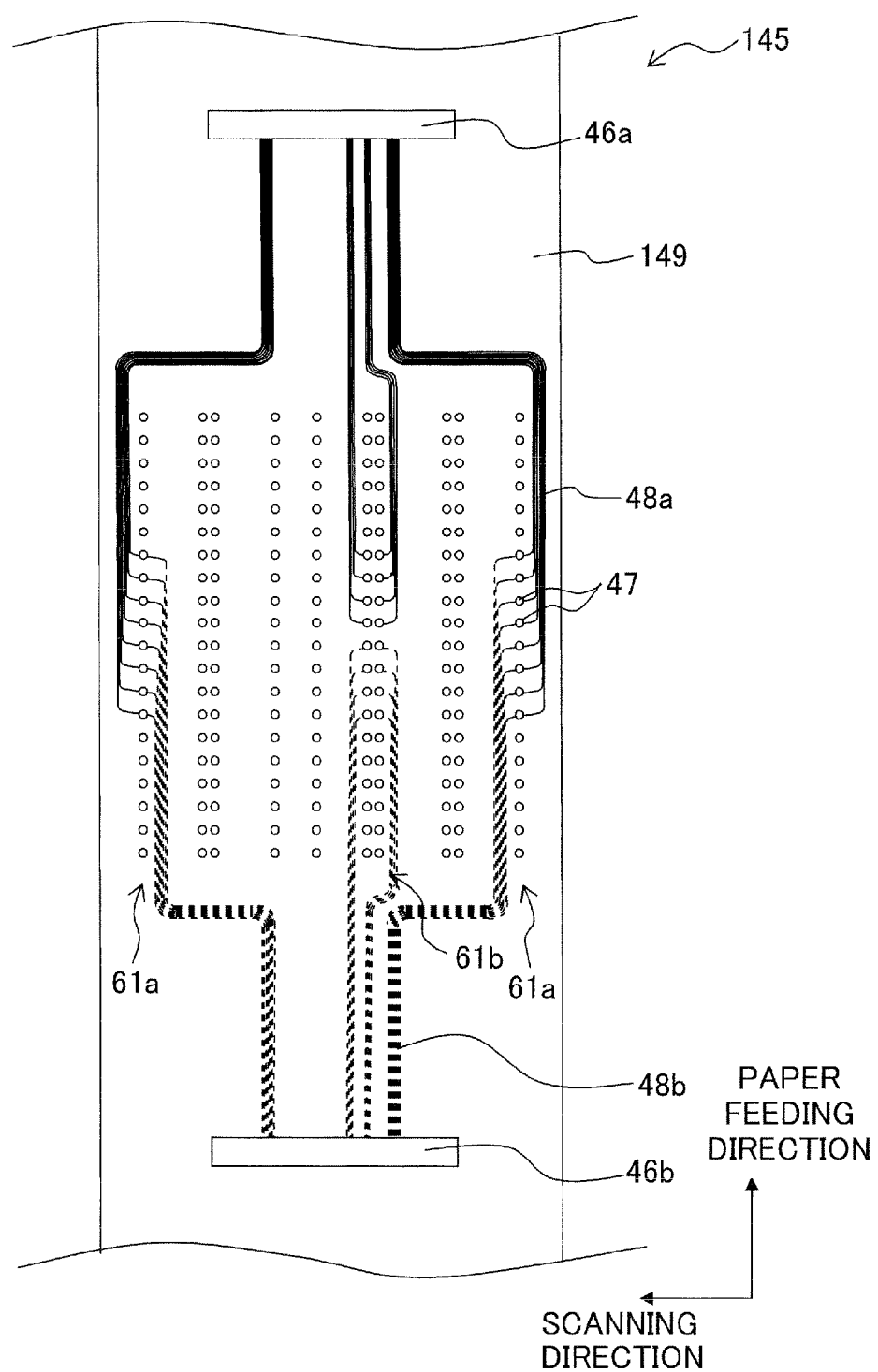
FIG. 9 is a plan view of a double-sided chip on film (COP).

Further, in this embodiment, a single-sided FPC in which the wiring lines are formed on one side is used. However, the present teaching is not limited thereto. For example, a wiring member which includes a FPC, a COF, etc., and in which the wiring lines are formed on both sides (the front and back surfaces) can be used. For example, as shown in FIG. 9, a double-sided COF 145 can be used instead of the FPC 45. It is allowable that the wiring lines 48a extending from the driver IC 46a disposed on one side in the paper feeding direction are arranged on the front surface of a board 149 of the double-sided COF 145 and the wiring lines 48b extending from the driver IC 46b disposed on the other side in the paper feeding direction are arranged on the back surface of the board 149 of the double-sided COF 145. Both of the two driver ICS 46a, 46b may be disposed on the front surface of the board 149 of the double-sided COF 145. In this case, the driver IC 46b disposed on the front surface of the board 149 of the double-sided COF 145 and the wiring lines 48b arranged on the back surface of the board 149 are electrically connected by, for example, a conductive material filled in through holes penetrating through the board 149. Further, the driver IC 46b may be disposed on the back surface of the board 149.

Further, in this embodiment, the active portions 41a are driven in a constant voltage manner in which the constant voltage is applied to the active portions 41a. However, the active portions 41a may be driven in a constant current manner in which the constant current is supplied to the active portions 41a.

Figure 10A:
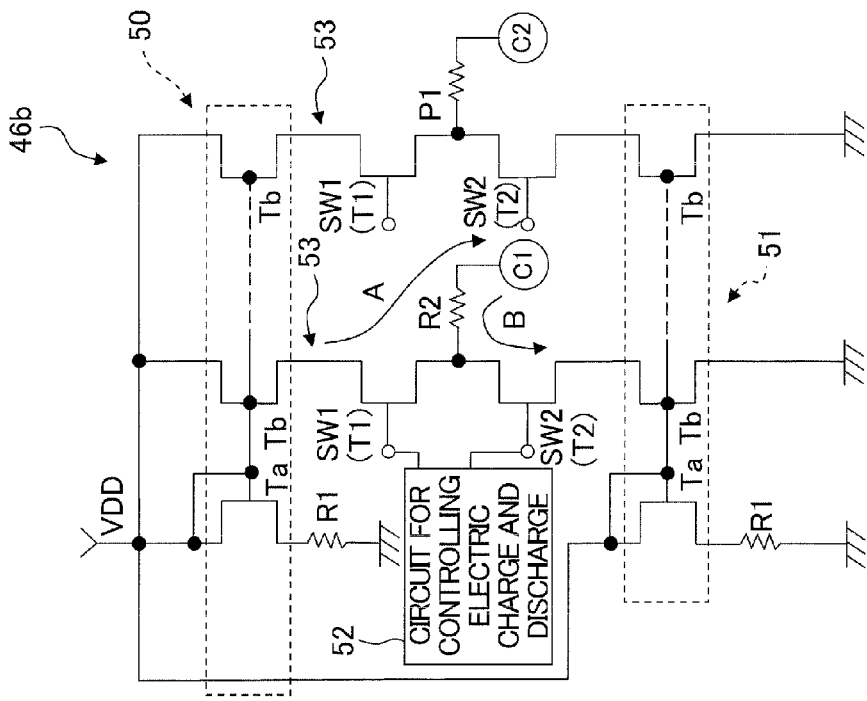
FIGS. 10A and 10B are circuit diagrams of the driver ICs.
Figure 10B:
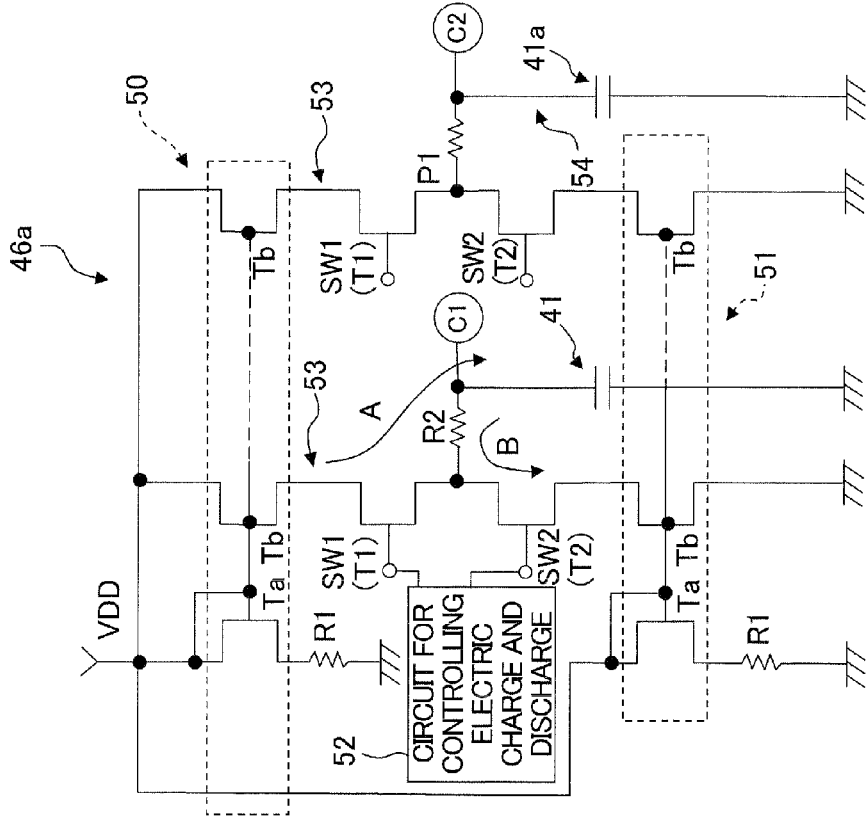

An explanation will be made about a specific construction of the driver IC 46 driving the active portions 41a in the constant current manner. In FIG. 10, in addition to the circuit diagrams of the two driver ICs 46a, 46b, the active portions 41a connected to both of the two driver ICs 46a, 46b are also shown. Further, a C1 and a C2 in FIG. 10 show points which mutually make conduction. Although these points are seemingly disposed away from each other in FIG. 10, these points are actually electrically connected to each other. As shown in FIG. 10, each of the driver ICs 46 includes two constant current sources (a charging-side constant current source 50 and a discharging-side constant current source 51) connected to a power-supply voltage (VDD), charging switches SW1 for switching between a connection state in which the charging-side constant current source 50 and the active portions 41a are connected and a disconnection state in which the charging-side constant current source 50 and the active portions 41a are not connected, discharging switches SW2 for switching between a connection state in which the discharging-side constant current source 51 and the active portions 41a are connected and a disconnection state in which the discharging-side constant current source 51 and the active portions 41a are not connected, and a circuit for controlling electric charge and discharge 52 which controls the switching of the charging switches SW1 and the switching of the discharging switches SW2.

Each of the charging-side constant current source 50 and the discharging-side constant current source 51 includes a MOSFET type transistor Ta, a resistance R1 connected to a source of the transistor Ta, and a plurality of MOSFET type transistors Tb which correspond to the plurality of the active portions 41a respectively. A drain of the transistor Ta of each of the constant current sources 50, 51 is connected to the power-supply voltage (VDD), and the source of the transistor Ta is connected to a ground via the resistance R1.

Drains of the plurality of transistors Tb of the charging-side constant current source 50 are connected to the power-supply voltage (VDD). Further, sources of the plurality of transistors Tb of the discharging-side constant current source 51 are connected to the ground. Furthermore, the sources of the transistors Tb of the charging-side constant current source 50 and the drains of the transistors Tb of the discharging-side constant current source 51 are connected to each other to construct a plurality of electric charge and discharge routes 53 each of which performs the electric charge and discharge of each of the active portions 41a described above. Connect routes 54 each of which is connected to the individual electrode 42 of the active portion 41a are branched from the electric charge and discharge routes 53, respectively. In FIG. 10, the connect route 54 branched from the electric charge and discharge route 53 of the driver IC 46a and the connect route 54 branched from the electric charge and discharge route 53 of the driver IC 46b are connected to the individual electrode 42 of the same active portion 41a. That is, the active portions 41a belonging to the bump rows 61a disposed on the opposite sides in the scanning direction in FIG. 4 are shown. Although the active portions 41a belonging to the remaining bump rows 61b in FIG. 4 are not shown in FIG. 10, the individual electrode 42 of each of the active portions 41a is connected with the connection route 54 branched from the electric charge and discharge route 53 of any one of the driver ICs 46. The connect route 54 includes the wiring resistance R2 of the wiring line 48 which is shown in FIG. 4 and connects the driver IC 46 to the bump 47.

In each of the constant current sources 50, 51, gate terminals of the transistors Ta, Tb are connected to each other, and the power-supply voltage (VDD) is applied to the gate terminals. As such, the transistors Ta, Tb construct current mirror circuits. In each circuit, the constant current determined by the resistance R1 is allowed to be flown between the drain of the transistor Ta and the source of the transistor Ta. Further, the constant current which is the same as that of the transistor Ta is allowed to be flown also between the drains and the sources of the transistors Tb constructing the current mirror circuits together with the transistor Ta. Therefore, the charging current supplied to the active portion 41a by the charging-side constant current source 50 is kept at constant at the time of the charge of the active portion 41a. Further, the discharging current from the active portion 41a is kept at constant by the discharging-side constant current source 51 at the time of the discharge from the active portion 41a. In this manner, the driver ICs 46a, 46b are controlled so that an amount of electric charge to be charged and discharged is made to be equal among the plurality of active portions 41a in a state that the charging current is kept at constant by using the charging-side constant current source 50 and that the discharging current is kept at constant by using the discharging-side constant current source 51. Therefore, it is possible to perform the operation uniformly among the plurality of active portions 41a by changing the voltage applied between the two types of electrodes sandwiching each active portion 41a therebetween, depending on degree of the electrostatic capacitance of each active portion 41a.

Each of the charging switches SW1 which is constructed of a MOSFET type transistor T1 is provided between the charging-side constant current source 50 and a branch point P1 of the connect route 54 from the electric charge and discharge route 53. Further, each of the discharging switches SW2 which is constructed of a MOSFET type transistor T2 is provided between the discharging-side constant current source 51 and the branch point P1. When the charging switch SW1 is in on state, the charge of the active portion 41a is carried out by connecting the charging-side constant current source 50 with the active portion 41a. Further, when the discharging switch SW2 is in on state, the discharge of the active portion 41a is carried out by connecting the discharging-side constant current source 51 with the active portion 41a.

The circuit for controlling electric charge and discharge 52 applies gate voltage to the gate terminals of the transistor T1 constructing the charging switch SW1 and the transistor T2 constructing the discharging switch SW2 which are provided in each of the electric charge and discharge routes 53 to turn on or turn off the charging switch SW1 and the discharging switch SW2.

More specifically, when the voltage is applied to the active portion 41a to cause the piezoelectric deformation in the active portion 41a, the circuit for controlling electric charge and discharge 52 turns on the charging switch SW1 and turns off the discharging switch SW2. Then, the charging-side constant current source 50 and the active portion 41a are connected, and the constant charging current is supplied to the active portion 41a via a route indicated by the arrow A in FIG. 10. Further, when the deformation of the active portion 41a is returned to provide the original form by making the voltage of the active portion 41a to be zero, the circuit for controlling electric charge and discharge 52 turns off the charging switch SW1 and turns on the discharging switch SW2. Then, the electric charge accumulated in the active portion 41a is discharged at the constant discharging current via a route indicated by the arrow B in FIG. 10.

In this situation, the circuit for controlling electric charge and discharge 52 controls a switch timings of the charging switch SW1 and the discharging switch SW2 (i.e. charge time and discharge time) so that the amount of electric charge to be charged and discharged is made to be equal among the plurality of active portions 41a.

Here, the voltage applied to the ink in each of the pressure chambers 34 (i.e. the energy applied to the ink jetted from each of the nozzles 35) is determined by an amount of piezoelectric deformation generated when the voltage (the potential difference between each of the individual electrodes 42 and the vibration plate 40 as the common electrode) is applied to each of the active portions 41a. However, when the electrostatic capacitance varies among the plurality of active portions 41a, even if the same voltage is applied to the active portions 41a, the amount of piezoelectric deformation differs depending on each amount of electrostatic capacitance. For example, the active portion 41a having a small thickness (having a large electrostatic capacitance) has a large amount of piezoelectric deformation, and the active portion 41a having a large thickness (having a small electrostatic capacitance) has a small amount of piezoelectric deformation.

In view of the above, in the relational expression $Q=CV$, Q is made to be constant by using the above constant current manner. Thus, the voltage applied to the active portion 41a having the large electrostatic capacitance is small, and on the contrary, the voltage applied to the active portion 41a having the small electrostatic capacitance is large. Accordingly, as compared with the constant voltage manner in which the active portion 41a is driven by applying the constant voltage, it is possible to suppress the variation of the amount of piezoelectric deformation among the plurality of active portions 41a. Therefore, the plurality of active portions 41a are driven uniformly, the variation of the amount of the ink jetted from each nozzle 35 of the channel unit 30 can be suppressed, and the variation of the jet characteristic of the ink from each nozzle 35 can be suppressed.

In the embodiment and the modifications as described above, the present teaching is applied to a piezoelectric actuator including a plurality of driver ICs and used for an ink-jet head which jets an ink onto a recording paper to record an image etc. However, the present teaching is not limited to application to such a piezoelectric actuator as utilized in the ink-jet head but applicable to piezoelectric actuators including the plurality of driver ICs utilized in various purposes.

What is claimed is:

1. A piezoelectric actuator device, comprising:
a piezoelectric actuator which includes a plurality of piezoelectric elements, each of the piezoelectric elements having two types of electrodes and a piezoelectric layer sandwiched between the two types of electrodes; and
a plurality of driver ICs; and
a plurality of wiring lines, each of which connects one of the driver ICs to one of the piezoelectric elements;
wherein each of the piezoelectric elements is connected to at least one of the driver ICs via one of the plurality of wiring lines, and is driven by the respective driver IC by changing a voltage applied between the two types of electrodes of the respective piezoelectric element;
wherein each piezoelectric element in a group of the piezoelectric elements is connected to at least two of the plurality of driver ICs.

2. The piezoelectric actuator device according to claim 1;
wherein each piezoelectric element in another group of the piezoelectric elements is connected to only one of the plurality of the driver ICs.

3. The piezoelectric actuator device according to claim 1;
wherein one piezoelectric element, of the group of the piezoelectric elements which are each connected to at least two of the plurality of driver ICs, is driven by only one of the plurality of driver ICs.

4. The piezoelectric actuator device according to claim 2;
wherein the group of the piezoelectric elements which are each connected to at least two of the plurality of driver ICs includes:
a large capacity piezoelectric element which has an electrostatic capacitance larger than a reference electrostatic capacitance; and
a small capacity piezoelectric element which has an electrostatic capacitance of not more than the reference electrostatic capacitance;
wherein the large capacity piezoelectric element is driven by at least two driver ICs of the plurality of driver ICs connected thereto; and
wherein the small capacity piezoelectric element is driven by only one of the plurality of driver ICs connected thereto.

5. The piezoelectric actuator device according to claim 2;
wherein each piezoelectric element, of the group of piezoelectric elements which are each connected to at least two of the plurality of driver ICs, has an electrostatic capacitance larger than a reference electrostatic capacitance and is driven by at least two driver ICs of the plurality of driver ICs connected thereto.

6. The piezoelectric actuator device according to claim 2;
wherein each of the driver ICs includes:
a charging-side constant current source supplying a charging current to each of the piezoelectric elements;
a discharging-side constant current source keeping a discharging current from each of the piezoelectric elements at constant; and
a control circuit which controls the charging-side constant current source and the discharging-side constant current source so that an amount of electric charge to be charged and discharged is made to be equal among the plurality of the piezoelectric elements.

7. The piezoelectric actuator device according to claim 2;
wherein as a length of each of wiring lines, of the plurality of the wiring lines, connecting one of the plurality of driver ICs to one piezoelectric element, of the group of piezoelectric elements which are each connected to at least two of the plurality of driver ICs, is longer, a width of the each of the wiring lines, of the plurality of the wiring lines, connecting one of the plurality of driver ICs to one piezoelectric elements, of the group of piezoelectric elements which are each connected to at least two of the plurality of driver ICs, is thicker.

8. The piezoelectric actuator device according to claim 2;
wherein the plurality of the piezoelectric elements are arranged planarly on one surface of the piezoelectric actuator to form a plurality of piezoelectric element rows, each of which is arranged to extend in an extending direction, and the plurality of the piezoelectric element rows are arranged, side by side, in an intersecting direction intersecting the extending direction;
wherein the piezoelectric actuator device further includes a wiring board which has connecting portions and extended portions, and on which the plurality of driver ICs are mounted on the extended portions respectively, the connecting portions being connected to the piezoelectric elements arranged on the one surface of the piezoelectric actuator respectively, the extended portions being disposed on both sides of the connecting portions in the extending direction and from which the plurality of the wiring lines, each of which is connected to one of the connecting portions, are drawn;
wherein a part of the plurality of piezoelectric element rows are formed from the group of piezoelectric elements which are each connected to at least two of the plurality of driver ICs; and
wherein the group of the piezoelectric elements, which are each connected to at least two of the plurality of driver ICs, is connected to one of the plurality of driver ICs connected thereto by a group of the plurality of the wiring lines from one side of the piezoelectric element rows to which the group of the piezoelectric elements belong; and
wherein the group of the piezoelectric elements are also connected to another driver IC of the plurality of driver ICs by another group of the plurality of wiring lines from the other side of the piezoelectric element rows to which the group of the piezoelectric elements belong.

9. The piezoelectric actuator device according to claim 2;
wherein the plurality of driver ICs drive the group of piezoelectric elements substantially at the same time.

10. The piezoelectric actuator device according to claim 2;
wherein the plurality of the piezoelectric elements are arranged flatly on one surface of the piezoelectric actuator to form a plurality of piezoelectric element rows, each of which is arranged to extend in an extending direction, and the plurality of the piezoelectric element rows are arranged, side by side, in an intersecting direction intersecting the extending direction;

wherein the plurality of driver ICs are disposed on both sides of the piezoelectric element rows in the extending direction; and wherein a group of the piezoelectric elements which belong to one of the piezoelectric element rows, and which are arranged at the center of the one of the piezoelectric element rows in the extending direction, are each connected to at least two of the plurality of driver ICs.

11. The piezoelectric actuator device according to claim 2;

wherein the plurality of the piezoelectric elements are arranged flatly on one surface of the piezoelectric actuator to form a plurality of piezoelectric element rows, each of which is arranged to extend in an extending direction, and the plurality of the piezoelectric element rows are arranged, side by side, in an intersecting direction intersecting the extending direction; and wherein one of the piezoelectric elements included in the piezoelectric element rows positioned at both ends of the piezoelectric element rows in the direction intersecting the extending direction is connected to the plurality of driver ICs.

12. The piezoelectric actuator device according to claim 2;

wherein the plurality of the piezoelectric elements are arranged flatly on one surface of the piezoelectric actuator to form a plurality of piezoelectric element rows, each of which is arranged to extend in an extending direction, and the plurality of the piezoelectric element rows are arranged, side by side, in an intersecting direction intersecting the extending direction;

wherein the piezoelectric actuator device further includes a wiring board which has connecting portions and extended portions and on which the plurality of driver ICs are mounted on the extended portions, the connecting portions being connected to the piezoelectric elements arranged on the one surface of the piezoelectric actuator respectively, the extended portions being disposed on both sides of the connecting portions in the extending direction and from which the plurality of the wiring lines, each of which is connected to one of the connecting portions, are drawn; and wherein each of the connecting portions connected to one piezoelectric element of the group of piezoelectric elements is connected to one of the extended portions from one side of the one of the extended portions in the intersecting direction and is connected to another extended portion from the other side of the another extended portion in the intersecting direction.

13. An ink-jet printer which jets an ink to perform printing on a printing medium, comprising:

an ink-jet head which is configured to be movable relative to the printing medium, which jets the ink onto the printing medium, and which includes:
- a channel unit in which a plurality of nozzles and ink channels are formed; and
- the piezoelectric actuator device as defined in claim 1 that is arranged to cover the channel unit; and a transporting mechanism which is configured to transport the printing medium toward the ink-jet head in a feeding direction.

* * * * *